US007176765B1

(12) United States Patent
Shorb et al.

(10) Patent No.: US 7,176,765 B1
(45) Date of Patent: Feb. 13, 2007

(54) PROGRAMMABLE TEMPERATURE-COMPENSATED RC OSCILLATOR

(75) Inventors: Jaynie A. Shorb, Quincy, WA (US); Steven L. Holmes, Sammamish, WA (US)

(73) Assignee: ZiLOG, Inc., San Jose, CA (US)

( * ) Notice: Subject to any disclaimer, the term of this patent is extended or adjusted under 35 U.S.C. 154(b) by 65 days.

(21) Appl. No.: 11/200,329

(22) Filed: Aug. 9, 2005

Related U.S. Application Data

(63) Continuation-in-part of application No. 11/026,750, filed on Dec. 31, 2004, now Pat. No. 7,102,452.

(51) Int. Cl.
*H03K 3/26* (2006.01)

(52) U.S. Cl. .................. 331/111; 331/143; 331/176
(58) Field of Classification Search ................ 331/111, 331/143, 176
See application file for complete search history.

(56) References Cited

U.S. PATENT DOCUMENTS

| 4,423,370 A | 12/1983 | Wilhelm ............... 323/315 |
| 4,893,095 A | 1/1990 | Thommen ................ 331/57 |
| 5,565,819 A | 10/1996 | Cooper ................. 331/111 |
| 4,786,825 A | 11/1996 | Califano ............... 395/600 |
| 5,793,260 A | 8/1998 | Fawal et al. ........... 331/111 |
| 5,811,993 A | 9/1998 | Dennard et al. ......... 327/54 |
| 5,889,441 A | 3/1999 | Inn .................... 331/143 |
| 6,239,585 B1 | 5/2001 | Buono ................. 323/282 |
| 6,496,075 B2 | 12/2002 | Justice et al. ........... 331/11 |
| 6,680,656 B2 * | 1/2004 | Chen ................... 331/143 |
| 7,053,724 B2 * | 5/2006 | Rusu et al. ............ 331/143 |

OTHER PUBLICATIONS

Vilas Boas, A. and Olmos, A., "A temperature compensated digitally trimmable on-chip IC oscillator with low voltage inhibit capability", IEEE Journal of Circuits and Systems, 2004, ISCAS 2004, Proceedings of the 2004 International Symposium, vol. 1, May 23-26, 2004, pp. I-501-I-504.
Shakiba, M.H.; Sowlati, T., "Automatic swing control in relaxation oscillators", IEEE Journal of Solid-State Circuits, vol. 33, Issue 12, Dec. 1998, pp. 1979-1986.

* cited by examiner

*Primary Examiner*—Arnold Kinkead
(74) *Attorney, Agent, or Firm*—Imperium Patent Works; Darien K. Wallace

(57) ABSTRACT

An on-chip oscillator generates a substantially temperature-independent clock signal by compensating for temperature-induced changes in its RC time constant and in a range between trigger voltages. A resistor with a positive temperature coefficient determines the range between trigger voltages, which increases with increasing temperature. A comparator response time contributes to a delay period that occurs after a trigger voltage is passed and before the charging or discharging of a capacitor is reversed. After the delay period, a remainder period elapses before another trigger voltage is passed. As temperature increases, the delay period is decreased by increasing a bias current supplied to the comparator. The bias current is programmably adjusted such that the sum of the delay period and the remainder period remains substantially constant over a large temperature range. Temperature trim bits are written to a register to adjust the bias current to compensate for process variations and simulation inaccuracies.

20 Claims, 12 Drawing Sheets

| TEMPERATURE (°C) | FREQUENCY (MHz) | VARIATION (%) | CURRENT | TEMPERATURE TRIM BITS T[5:0] |
|---|---|---|---|---|
| -40 | 5.90 | 6.8% | FULL CURRENT | [111111] |
| 30 | 5.52 | -0.1% | | |
| 105 | 5.10 | -7.8% | | |
| -40 | 5.85 | 5.9% | 1/2 CURRENT | [011111] |
| 30 | 5.54 | 0.2% | | |
| 105 | 5.12 | -7.4% | | |
| -40 | 5.81 | 5.1% | 1/4 CURRENT | [001111] |
| 30 | 5.55 | 0.5% | | |
| 105 | 5.20 | -6.0% | | |
| -40 | 5.71 | 3.3% | 1/8 CURRENT | [000111] |
| 30 | 5.55 | 0.4% | | |
| 105 | 5.31 | -4.0% | | |
| -40 | 5.59 | 1.1% | 1/12 CURRENT | [001011] |
| 30 | 5.50 | -0.5% | | |
| 105 | 5.33 | -3.6% | | |
| -40 | 5.44 | -1.6% | 1/16 CURRENT | [000011] |
| 30 | 5.55 | 0.4% | | |
| 105 | 5.45 | -1.5% | | |

FIG. 18

| TEMPERATURE (°C) | VARIATION (%) | | | | |
|---|---|---|---|---|---|
| | TYPICAL | SLOW/SLOW | SLOW/FAST | FAST/SLOW | FAST/FAST |
| -40 | -1.6% | -1.4% | -0.9% | -1.5% | -1.2% |
| 30 | -0.2% | 0.0% | 0.3% | -0.2% | -0.4% |
| 105 | -1.6% | -1.5% | -1.2% | -2.3% | -1.9% |

PROGRAMMABLE TEMPERATURE-COMPENSATED RC OSCILLATOR

CROSS REFERENCE TO RELATED APPLICATION

This application is a continuation-in-part of, and claims priority under 35 U.S.C. §120 from, nonprovisional U.S. patent application Ser. No. 11/026,750, now U.S. Pat. No. 7,102,452, entitled "Temperature-Compensated RC Oscillator," filed on Dec. 31, 2004, the subject matter of which is incorporated herein by reference.

TECHNICAL FIELD

The present invention relates generally to clock circuits and, specifically, to an on-chip, precision RC oscillator that controls a bias current to compensate for temperature variation of the oscillation. More specifically, the present invention relates to programmably adjusting the bias current of comparators to compensate for temperature variation.

BACKGROUND

Microcontrollers are found in wide variety of products, such as electronic consumer devices, household appliances and even cars. A product can best be controlled by a microcontroller that is clocked by a stable and accurate oscillating signal. One method of generating a stable and accurate clock signal is to use a phase-locked loop (PLL) that receives an accurate reference signal from an external crystal oscillator. Manufacturing costs can be reduced, however, by generating the clock signal using an internal, on-chip oscillator as opposed to a more expensive external crystal oscillator.

An internal precision oscillator in a microcontroller can be an RC oscillator. A capacitor of the RC circuit is charged and discharged after the voltage across the capacitor reaches a lower and upper trigger voltage, respectively. The rate at which the capacitor is charged and discharged depends on the RC time constant of the RC circuit. The output frequency can be tuned by controlling either the capacitance of the capacitor and/or the resistance of the resistor in the RC circuit.

In some applications, a microcontroller experiences a wide variation in its operating temperature. Temperature variation can affect the frequency of the clock signal output by the RC oscillator, and that clock signal may become insufficiently stable and accurate for the particular application. For example, the RC oscillator may contain a resistor whose resistance changes with temperature, i.e., the resistor has a positive or negative temperature coefficient. A change in resistance may effect not only the RC time constant, but also the trigger voltages at which the capacitor is charged and discharged.

FIG. 1 (prior art) shows a conventional RC oscillator 10 with an RC circuit 11. Oscillator 10 has an RS latch 12 for switching between the output of two comparators. An RC node 13 is coupled to a inverting input lead 14 of a discharge comparator 15 and to a non-inverting input lead 16 of a charge comparator 17. Charge comparator 17 detects when the voltage on RC node 13 reaches a lower reference voltage, at which time RS latch 12 causes charge to accumulate on RC node 13. Discharge comparator 15 detects when the voltage on RC node 13 reaches a higher reference voltage, at which time RS latch 12 causes charge to discharge from RC node 13. The reference voltages are generated by a voltage divider 18 formed by a resistor string. As the operating temperature of oscillator 10 changes, the resistances of the resistors in the resistor string change, thereby changing the reference voltages.

FIG. 2 (prior art) is a waveform diagram illustrating the change in frequency of the clock signal output by oscillator 10 as a result of a change in the reference voltages caused by a temperature variation. Oscillator 10 outputs a clock signal 19 at a lower temperature and a slower clock signal 20 at a higher temperature. In this example, as the temperature increases, the resistance of each resistor in voltage divider 18 increases. The increased resistance causes a lower reference voltage 21 to increase and an upper reference voltage 22 to increase by an even greater absolute amount. Lower reference voltage 21 increases from 1 V to 1.2 V. Upper reference voltage 22 increases from 3 V to 3.6 V. Thus, a range 23 between reference voltages is 2 V at a lower temperature. At a higher temperature, oscillator 10 exhibits a range 24 of 2.4 V between reference voltages. Where the RC time constant does not change with temperature, the period 25 required to charge and discharge RC node 13 over range 24 of 2.4 V is longer than the period 26 required to charge and discharge RC node 13 over range 23 of 2 V. The frequency of the clock signal output by oscillator 10, therefore, decreases as temperature increases. Moreover, where the resistance of the resistor in RC circuit 11 increases with increasing temperature, the RC time constant also increases, which slows the frequency of the clock signal even more.

One method of compensating for resistance changes caused by temperature variation in RC oscillators relies on matching resistors with positive temperature coefficients to resistors having negative temperature coefficients. U.S. Pat. No. 5,889,441, which is herein incorporated by reference, describes an RC oscillator whose output frequency is substantially independent of temperature variation because the RC oscillator uses matched resistor pairs whose combined resistance is substantially temperature independent. It can be difficult, however, to manufacture an on-chip resistor whose temperature coefficient inversely matches that of its paired resistor over the entire operating temperature range of a microcontroller.

Another method for compensating for temperature variations uses a separate regulator circuit that generates precise reference voltages. The regulator circuit generates temperature independent reference voltages that are used by the comparators as trigger voltages. Especially where the RC oscillator is on the microcontroller chip, however, the regulator circuit occupies valuable space.

A method is sought for generating a clock signal from an RC oscillator that is substantially temperature independent and that does not require matched resistor pairs or a reference voltage regulator circuit.

SUMMARY

An internal, on-chip temperature-compensated precision oscillator generates a clock signal whose frequency remains substantially stable over a large range of operating temperatures. The oscillator is fully integrated on a semiconductor substrate and does not require external components. The temperature-compensated oscillator compensates for temperature-induced changes in an RC circuit and in a range between an upper trigger voltage and a lower trigger voltage. The range between trigger voltages increases with increasing temperature because it is established using a resistor with a positive temperature coefficient. A delay period occurs after one trigger voltage is passed and before the charging or discharging of a capacitor charge node is reversed. The response time of an upper trigger voltage comparator is part of the delay period. Following the delay period, a remainder period elapses until the voltage on the capacitor charge node passes the other trigger voltage. The response time of a lower trigger voltage comparator is part of another delay period, which is followed by another remainder period.

As temperature increases, the temperature-compensated oscillator increases the source current supplied to the upper trigger voltage comparator and the sink current supplied to the lower trigger voltage comparator in order to decrease the response times. In addition, as temperature increases, the temperature-compensated oscillator increases a charge/discharge current supplied to the capacitor charge node so that the capacitor charges and discharges faster as the range between trigger voltages increases. The temperature-compensated oscillator adjusts the source and sink bias currents to the comparators and the charge/discharge current to the capacitor charge node so that the sum of the delay period and the remainder period remains substantially constant over a large range of operating temperatures of the temperature-compensated oscillator.

In one embodiment, the bias currents to the comparators and the charge/discharge current are programmably adjusted to compensate more accurately for temperature induced variations in the frequency output by the temperature-compensated oscillator. The temperature-compensated oscillator includes a programmable temperature trim register that is used to adjust comparator bias currents. In addition, the temperature-compensated oscillator includes a programmable charge rate register that is used to adjust the charge/discharge current. The temperature-compensated oscillator also includes a programmable oscillator control register used to control the capacitance of the RC time constant.

In another embodiment, the temperature-compensated oscillator adjusts the source and sink currents to the comparators, but not the charge/discharge current so that the delay period is decreased to compensate for any increase in the remainder period as temperature increases. In yet another embodiment, the temperature-compensated oscillator adjusts only the charge/discharge current so that the capacitor charge node charges and discharges faster to compensate for any increase in the range between trigger voltages as temperature increases.

A method detects a start time when the voltage on the charge node reaches a first trigger voltage. A delay period begins at the start time, ends at an end time, and depends on a comparator source current. The method inverts a digital signal at the end time and then detects when the voltage on the charge node reaches a second trigger voltage. A remainder period begins at the end time and ends when the voltage on the charge node reaches the second trigger voltage. The second trigger voltage is a first voltage at a first temperature and a second voltage at a second temperature. The method programmably adjusts the comparator bias currents such that the sum of the delay period and the remainder period is substantially constant at the first temperature and at the second temperature.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 18 is a table showing how the frequency output by the internal temperature-compensated precision oscillator of FIG. 14 varies with temperature at various comparator bias current levels.

FIG. 19 is a table showing how the frequency output by the internal temperature-compensated precision oscillator of FIG. 14 varies with temperature with various fabrication process changes.

DETAILED DESCRIPTION

Reference will now be made in detail to some embodiments of the invention, examples of which are illustrated in the accompanying drawings.

Figure 1:
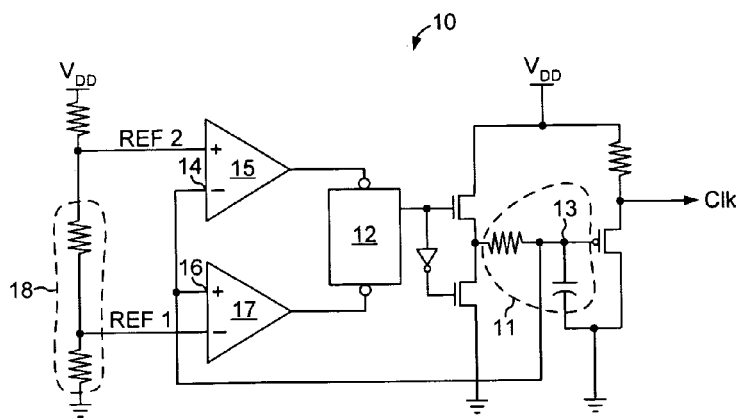
FIG. 1 (prior art) is a simplified schematic diagram of a conventional RC oscillator.
Figure 2:
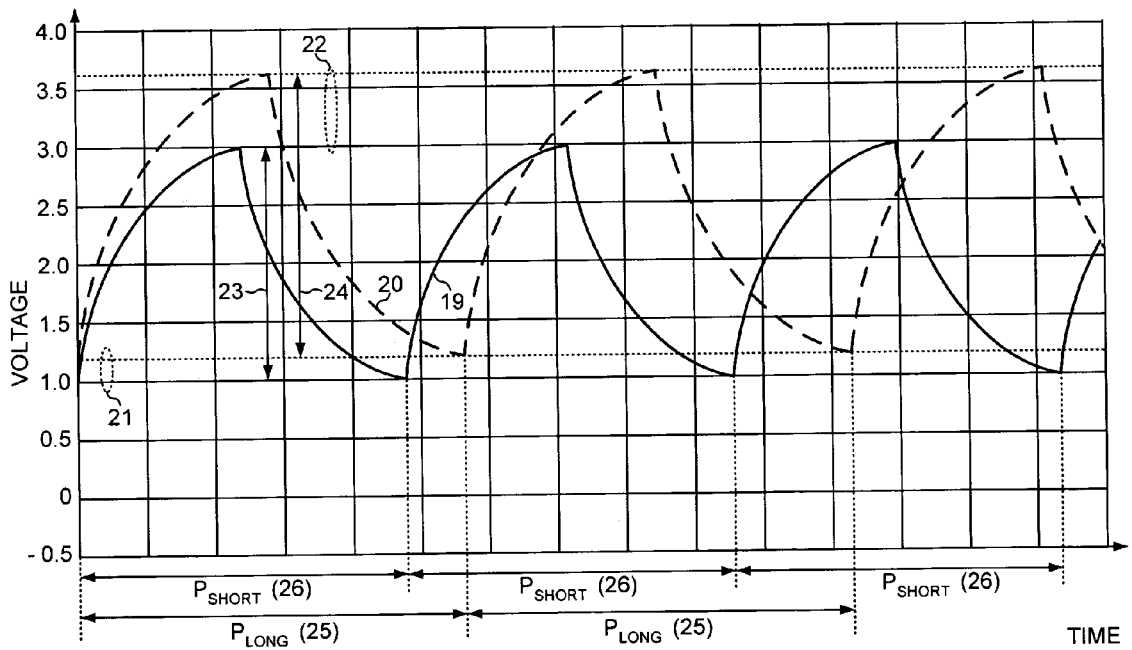
FIG. 2 (prior art) is a waveform diagram illustrating the temperature dependence of the output frequency of the RC oscillator of FIG. 1.
Figure 3:
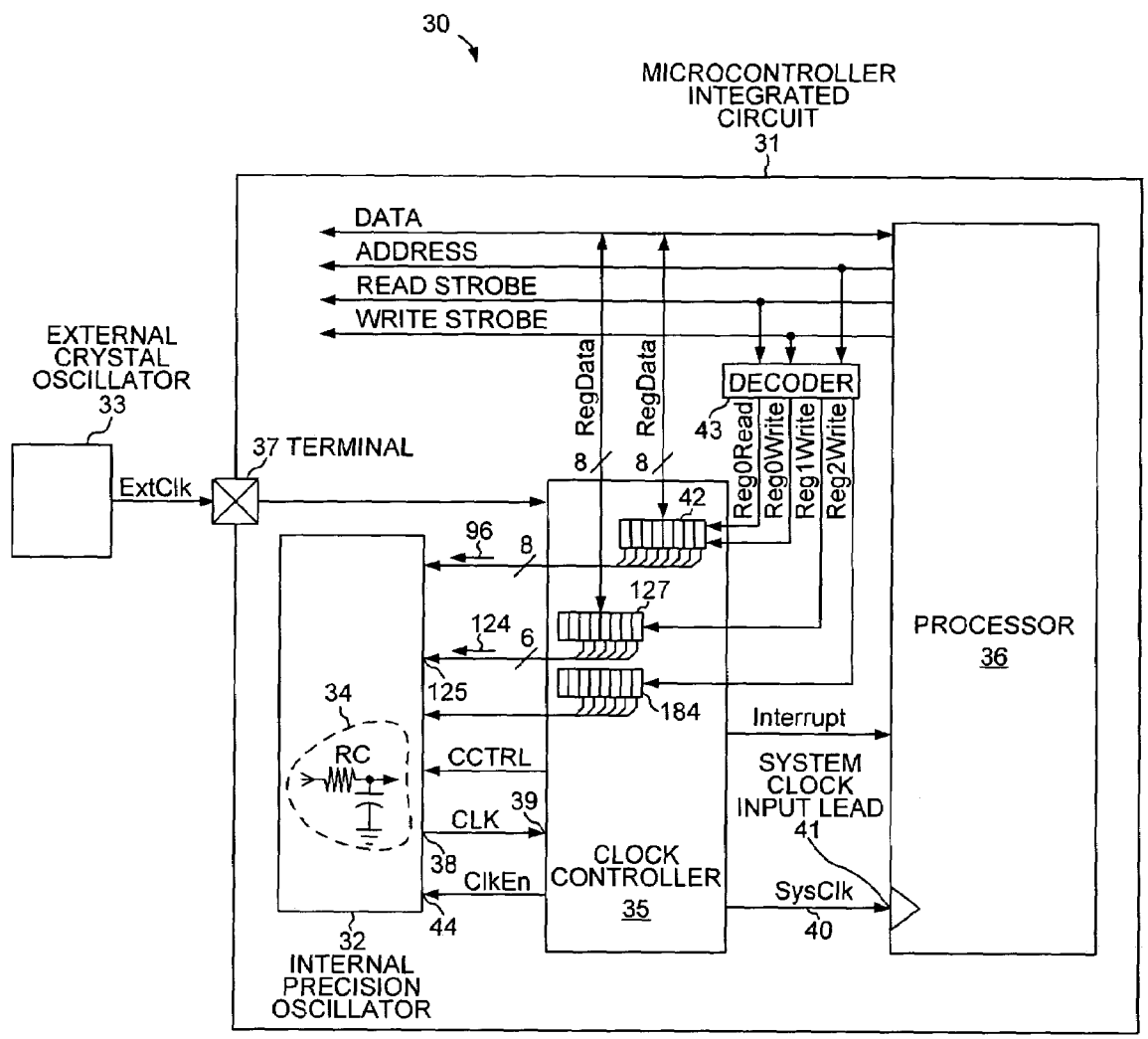
FIG. 3 is a simplified schematic diagram of a microcontroller system that includes an internal temperature-compensated precision oscillator.

FIG. 3 is a system-level diagram of a microcontroller system 30 in accordance with one specific embodiment. Microcontroller system 30 includes both a microcontroller integrated circuit 31 with an on-chip temperature-compensated precision oscillator 32, as well as an external crystal oscillator 33. Internal temperature-compensated precision (ITCP) oscillator 32 is an RC oscillator without an external crystal and includes an RC circuit 34. Microcontroller integrated circuit 31 includes a clock controller 35 that determines whether external crystal oscillator 33 or ITCP oscillator 32 clocks a processor 36 of microcontroller integrated circuit 31. For some applications, despite variations in the operating temperature of microcontroller integrated circuit 31, ITCP oscillator 32 can generate a clock signal that is sufficiently stable and accurate to clock processor 36. For these applications, cost can be reduced by excluding external crystal oscillator 33 from microcontroller system 30.

External crystal oscillator 33 provides a high-speed external clock signal (ExtClk) to clock controller 35 via a terminal 37 on microcontroller integrated circuit 31. ITCP oscillator 32 outputs an internal clock signal (CLK) onto an internal clock output lead 38 and to an input lead 39 of clock controller 35. Clock controller 35 outputs either external clock signal (ExtClk) or internal clock signal (CLK) onto a system clock line 40 and to a system clock input lead 41 of processor 36. Clock controller 35 includes a programmable oscillator control register 42. Using an address decoder 43, processor 36 can both read from and write to register 42.

In the specific embodiment of FIG. 3, ITCP oscillator 32 can be disabled such that it does not oscillate and thereby consumes minimal power. If an enable signal ClkEn provided to clock enable lead 44 is deasserted, then ITCP oscillator 32 is disabled and is prevented from oscillating. If, on the other hand, the ClkEn signal asserted, then ITCP oscillator 32 is enabled and generates the internal clock signal (CLK) that is provided as the system clock to processor 36.

In one example of the operation of microcontroller system 30, ITCP oscillator 32 is initially disabled. When clock controller 35 detects that the external clock signal (ExtClk) output by external precision oscillator 33 is inadequate, then clock controller 35 enables ITCP oscillator 32 such that ITCP oscillator 32 generates the internal clock signal (CLK). Clock controller 35 switches the source of the system clock (SysClk) used to clock processor 36 from external crystal oscillator 33 to ITCP oscillator 32. Once the switch has been made, the internal clock signal (CLK) clocks processor 36. For additional details on a clock controller that automatically switches from a failed clock source to a new clock source, such as an internal precision oscillator, see U.S. patent application Ser. No. 10/764,391 entitled "Clock Controller with Clock Source Fail-Safe Logic," filed on Jan. 23, 2004, which is herein incorporated by reference.

Figure 4:
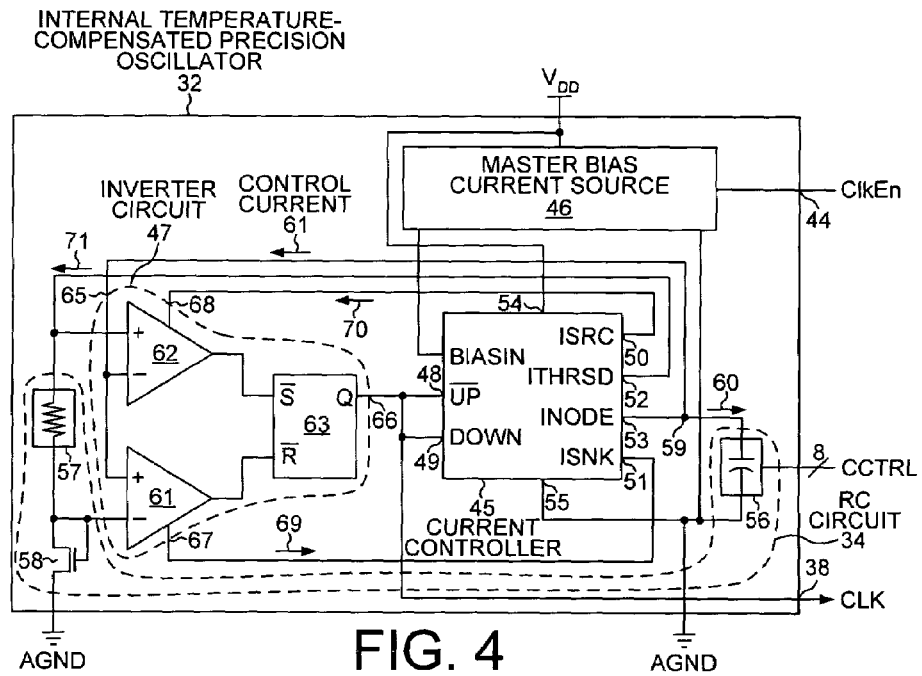
FIG. 4 is a more detailed schematic diagram of the internal temperature-compensated precision oscillator shown in FIG. 3.

FIG. 4 shows ITCP oscillator 32 in more detail. ITCP oscillator 32 includes a current controller 45, a master bias current source 46, an inverter circuit 47 and RC circuit 34. Current controller 45 has a control up bar lead 48, a control down lead 49, an inverter source output lead 50, an inverter sink output lead 51, a trigger voltage source lead 52, an output lead 53, a supply voltage lead 54, and an analog ground lead 55. RC circuit 34 includes a capacitor array 56, a resistor string 57 and a diode-connected n-channel field-effect transistor (FET) 58. In another embodiment, diode-connected transistor 58 is a bipolar transistor. Capacitor array 56 is coupled to a charge node 59 and to analog ground potential (AGND). Charge node 59 is also coupled to output lead 53 of current controller 45. Current controller 45 outputs a charge/discharge current 60 that alternately charges and discharged charge node 59. The frequency of internal clock signal (CLK) output onto internal clock output lead 38 corresponds to the rate at which charge on charge node 59 charges and discharges.

Inverter circuit 47 includes a lower trigger voltage comparator 61, an upper trigger voltage comparator 62, and an RS latch 63 for switching between comparators 61 and 62. In addition, inverter circuit 47 has an inverter input lead 65, a switching lead 66, an inverter current sink lead 67, and an inverter current source lead 68. Switching lead 66 is coupled to both control up bar lead 48 and control down lead 49 of current controller 45. Charge node 59 is coupled to inverter input lead 65, which in turn is coupled to both the non-inverting input lead of lower trigger voltage comparator 61 and the inverting input lead of upper trigger voltage comparator 62. Inverter current sink lead 67 of inverter circuit 47 is coupled to inverter sink output lead 51 of current controller 45. Current controller 45 draws an inverter sink current (ISNK) 69 into inverter sink output lead 51. Inverter current source lead 68 of inverter circuit 47 is coupled to inverter source output lead 50 of current controller 45. Current controller 45 outputs an inverter source current (ISRC) 70 onto inverter source output lead 50. Inverter sink current (ISNK) 69 and inverter source current (ISRC) 70 are bias currents for lower trigger voltage comparator 61 and upper trigger voltage comparator 62, respectively.

The voltage on charge node 59 decreases when charge/discharge current 60 discharges current from charge node 59. Because charge node 59 is coupled to the non-inverting input lead of lower trigger voltage comparator 61, lower trigger voltage comparator 61 outputs a digital low when the voltage on charge node 59 falls below a lower trigger voltage present on the inverting input lead of lower trigger voltage comparator 61. Upon receiving a digital low on a reset bar input lead (R_bar), RS latch 63 is reset, thereby outputting a digital low onto output lead Q and, in turn, onto switching lead 66 of inverter circuit 47. When a digital low is received on control up bar lead 48 of current controller 45, current controller 45 begins to source current onto charge node 59. The voltage on charge node 59 rises at a rate proportional to a time constant RC, where R is the resistance of resistor string 57 and C is the capacitance of capacitor array 56. The rate at which voltage on charge node 59 rises also depends on the magnitude of charge/discharge current 60.

When the voltage on charge node 59 rises above an upper trigger voltage present on the non-inverting input lead of upper trigger voltage comparator 62, upper trigger voltage comparator 62 outputs a digital low. Upon receiving a digital low on a set bar input lead (S_bar), RS latch 63 is set, thereby outputting a digital high onto output lead Q. When a digital high is received on control down lead 49 of current controller 45, current controller 45 draws current from charge node 59 until the voltage on charge node 59 next falls below the lower trigger voltage. The time that elapses from when the voltage on charge node 59 falls below the lower trigger voltage until that voltage next falls below the lower trigger voltage equals the period of a cycle of internal clock signal (CLK) output onto internal clock output lead 38 by ITCP oscillator 32.

In one embodiment, resistor string 57 is a series of four on-chip, p-channel diffusion resistors. Each resistor has a width of 5 microns. The four resistors have lengths of 95, 142.5, 285 and 500 microns, respectively. By incorporating the resistors on-chip, they can be manufactured with a less-costly MOS process, but therefore exhibit a positive temperature coefficient. The range between the upper and lower trigger voltages is set by the magnitude of a trigger voltage current (ITHRSD) 71 flowing through the resistance R of resistor string 57. Trigger voltage source lead 52 of current controller 45 is coupled to resistor string 57, and current controller 45 outputs trigger voltage current (ITHRSD) 71 onto trigger voltage source lead 52. As the total resistance R of the four resistors increases with increasing temperature, the range between the upper and lower trigger voltages also increases. The frequency of internal clock signal (CLK) output by ITCP oscillator 32 would decrease as the resistance of resistor string 57 increases with increasing temperature if the magnitudes of trigger voltage current (ITHRSD) 71, inverter sink current (ISNK) 69 and inverter source current (ISRC) 70 were all held constant.

Figure 5:
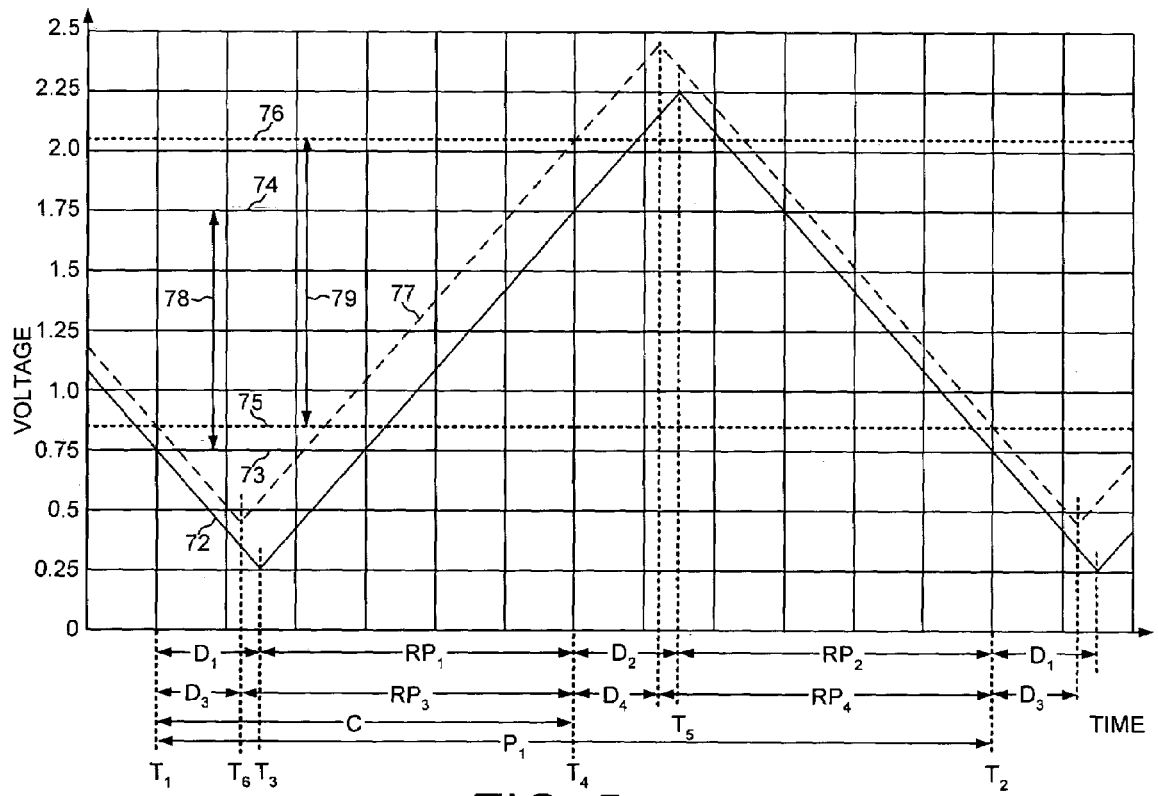
FIG. 5 is a waveform diagram illustrating that the output frequency of the internal temperature-compensated precision oscillator of FIG. 3 is substantially temperature independent.

FIG. 5 is a simplified, idealized waveform diagram that illustrates how ITCP oscillator 32 compensates for changes in the resistance R of resistor string 57 caused by temperature variation in order to generate an internal clock signal (CLK) that is substantially independent of operating temperature. FIG. 5 shows a node voltage signal 72 present on charge node 59 at a first temperature. The time that elapses from a time $T_1$ at which the voltage of node voltage signal 72 falls below a lower trigger voltage 73 until a time $T_2$ at which the voltage of node voltage signal 72 next falls below lower trigger voltage 73 equals the period $P_1$ of one cycle of node voltage signal 72 at the first temperature. The period $P_1$ corresponds to the frequency of clock pulses output by ITCP oscillator 32 as internal clock signal (CLK).

The voltage on charge node 59 does not begin to rise immediately after the voltage of node voltage signal 72 falls below lower trigger voltage 73 at time $T_1$. Instead, there is a delay period $D_1$ before current controller 45 switches the direction of charge/discharge current 60 at $T_3$ to add charge to charge node 59. Delay period $D_1$ includes the time it takes after $T_1$ until lower trigger voltage comparator 61 outputs a digital low. A remainder period $RP_1$ occurs from time $T_3$ when current controller 45 begins to add charge to charge node 59 until a time $T_4$ when the voltage of node voltage signal 72 rises above an upper trigger voltage 74. In this example, the delay period $D_1$ plus the remainder period $RP_1$ is approximately a half cycle (C) of node voltage signal 72, which equals approximately half of the period $P_1$ of a cycle of internal clock signal (CLK).

An additional delay period $D_2$ occurs before current controller 45 switches the direction of charge/discharge current 60 at $T_5$ to discharge charge from charge node 59. Delay period $D_2$ includes the time it takes after $T_4$ until upper trigger voltage comparator 62 outputs a digital low. A remainder period $RP_2$ occurs from time $T_5$ when current controller 45 begins to discharge charge from charge node 59 until time $T_2$ when the voltage of node voltage signal 72 again falls below lower trigger voltage 73. ITCP oscillator 32 is designed such that delay period $D_1$ of lower trigger voltage comparator 61 and delay period $D_2$ of upper trigger voltage comparator 62 are substantially identical at any given temperature. By manufacturing comparators 61 and 62 with the same semiconductor process on the same chip, delay period $D_1$ can be made to track delay period $D_2$.

FIG. 5 also shows a node voltage signal 77 (shown as a dashed triangular wave) at a second temperature that is higher than the first temperature. Because resistor string 57 has a positive temperature coefficient, its resistance R is larger at the second temperature. In this example, the larger resistance R increases both the lower and the upper trigger voltages received by comparators 61 and 62, respectively. The upper trigger voltage, however, increases by a larger absolute amount than does the lower trigger voltage. In the example of FIG. 5, the lower trigger voltage 73 of 0.75 V increases to an increased lower trigger voltage 75 of about 0.85 V. The upper trigger voltage 74 of 1.75 V increases even more to an increased upper trigger voltage 76 of about 2.1 V. Thus, a range 78 between lower and upper trigger voltages is 1 V at the temperature of node voltage signal 72, whereas a range 79 between trigger voltages is about 1.25 V at the higher temperature of node voltage signal 77.

Despite the different ranges between trigger voltages, however, ITCP oscillator 32 generates internal clock signal (CLK) with a period that is substantially independent of the temperature induced changes to the trigger voltages. As will be described below, ITCP oscillator 32 adjusts charge/discharge current 60 to compensate for the temperature induced changes to the RC time constant so that charge node 59 charges and discharges at the same rate over the entire range of operating temperatures of ITCP oscillator 32. Therefore, charge/discharge current 60 charges and discharges charge node 59 at the same rate at both the temperatures of node voltage signal 72 and node voltage signal 77, i.e., the slopes of signals 72 and 77 are the same.

As the range between trigger voltages increases, it takes longer for the charge on charge node 59 to charge and discharge to the next trigger voltage, and the remainder period RP increases. Node voltage signal 77 requires a longer remainder period $RP_3$ to charge up to increased upper trigger voltage 76 than the remainder period $RP_1$ taken by node voltage signal 72 to charge up to upper trigger voltage 74. To compensate for the increased remainder period, ITCP oscillator 32 shortens the delay period before current controller 45 switches the direction of charge/discharge current 60 to add charge to charge node 59. Because the delay period includes the time it takes after crossing the lower trigger voltage until lower trigger voltage comparator 61 outputs a digital low, ITCP oscillator 32 can shorten the delay period by shortening the response time of lower trigger voltage comparator 61. Current controller 45 adjusts inverter sink current (ISNK) 69 to shorten the response time of lower trigger voltage comparator 61, thereby reducing the delay period to a shortened delay period $D_3$. ITCP oscillator 32 thereby adjusts the delay period such that the sum of the delay period plus the following remainder period remains substantially constant at the temperature of node voltage signal 72 and at the higher temperature of a node voltage signal 77. At both temperatures, the sum of the delay period and the remainder period is half cycle (C). FIG. 5 shows that at both temperatures $D_1+RP_1=D_3+RP_3=C$.

In a similar fashion, current controller 45 adjusts inverter source current (ISRC) 70 to shorten the response time of upper trigger voltage comparator 62, thereby reducing the delay period to a shortened delay period $D_4$ at the higher temperature of a node voltage signal 77.

ITCP oscillator 32 thereby adjusts the delay period such that the sum of the delay period plus the following remainder period is substantially constant at the temperature of node voltage signal 72 and at the higher temperature of a node voltage signal 77. At both temperatures, ITCP oscillator 32 adjusts the delay period such that the sum of the second delay period and the second remainder period remains constant. FIG. 5 also shows that at both temperatures $D_2+RP_2=D_4+RP_4$. Because $D_1+RP_1+D_2+RP_2=D_3+RP_3+D_4+RP_4=P_1$, the period $P_1$ of a cycle of internal clock signal (CLK) output by ITCP oscillator 32 remains constant over the entire range of operating temperatures of ITCP oscillator 32.

Figure 6:
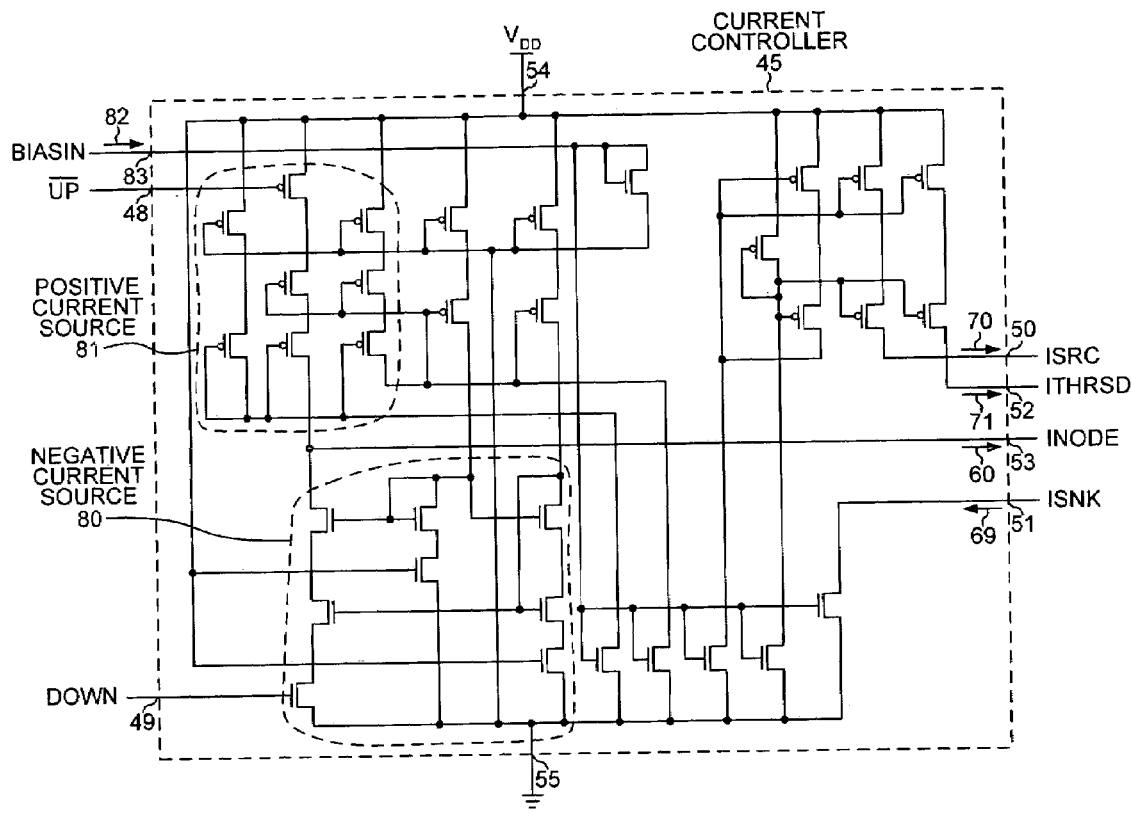
FIG. 6 is a more detailed schematic diagram of the components of a current controller of the internal temperature-compensated precision oscillator of FIG. 3.

FIG. 6 shows current controller 45 in more detail. Current controller 45 receives the output of inverter circuit 47 on control up bar lead 48 and control down lead 49. When a digital high is received on control down lead 49, a negative current source 80 turns on and causes charge/discharge current 60 to draw current from charge node 59. When a digital low is received on control up bar lead 48, a positive current source 81 causes charge/discharge current 60 to supply current onto charge node 59. Current controller 45 also receives a master bias current 82 on a BIASIN lead 83 from master bias current source 46. Based on master bias current 82 and the output of inverter circuit 47, current controller 45 outputs four current signals: charge/discharge current 60, inverter sink current (ISNK) 69, inverter source current (ISRC) 70, and trigger voltage current (ITHRSD) 71. These four current signals vary with temperature and scale together.

Current controller 45 and master bias current source 46 together adjust charge/discharge current 60 to compensate for the temperature induced changes to the RC time constant so that charge/discharge current 60 charges and discharges charge node 59 at the same rate over the entire range of operating temperatures of ITCP oscillator 32. For example, where the RC time constant increases with increasing temperature, an increasing amount of current flows through positive current source 81 and increases the magnitude of charge/discharge current 60.

Figure 7:
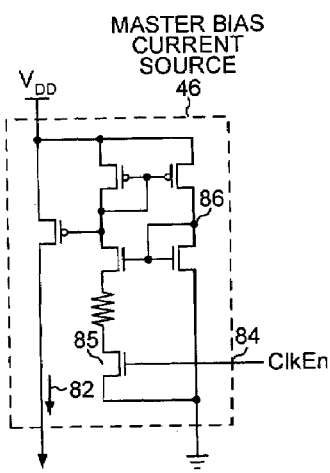
FIG. 7 is a more detailed schematic diagram of the components of a master bias current source of the internal temperature-compensated precision oscillator of FIG. 3.

FIG. 7 shows master bias current source 46 in more detail. Master bias current source 46 is a Widlar current source modified for a CMOS manufacturing process. Master bias current source 46 is a positive-to-absolute-temperature (PTAT) current source and exhibits a positive temperature coefficient. Master bias current source 46 generates master bias current 82. An enable input lead 84 of master bias current source 46 is coupled to clock enable lead 44 of ITCP oscillator 32. When the enable signal ClkEn that is received on enable input lead 84 is asserted, the drain of a transistor 85 is pulled to ground, and master bias current source 46 outputs master bias current 82. On the other hand, when the enable signal ClkEn is deasserted, master bias current source 46 provides no master bias current 82 to current controller 45, an no charge/discharge current 60 is produced. Consequently, ITCP oscillator 32 is disabled and no internal clock signal (CLK) is generated.

In an alternative embodiment, a startup circuit is coupled to a node 86 of master bias current source 46. The startup time of ITCP oscillator 32 speeds up to about a few milliseconds with the startup circuit, as opposed to a startup time of about a few microseconds without the startup circuit.

Figure 8:
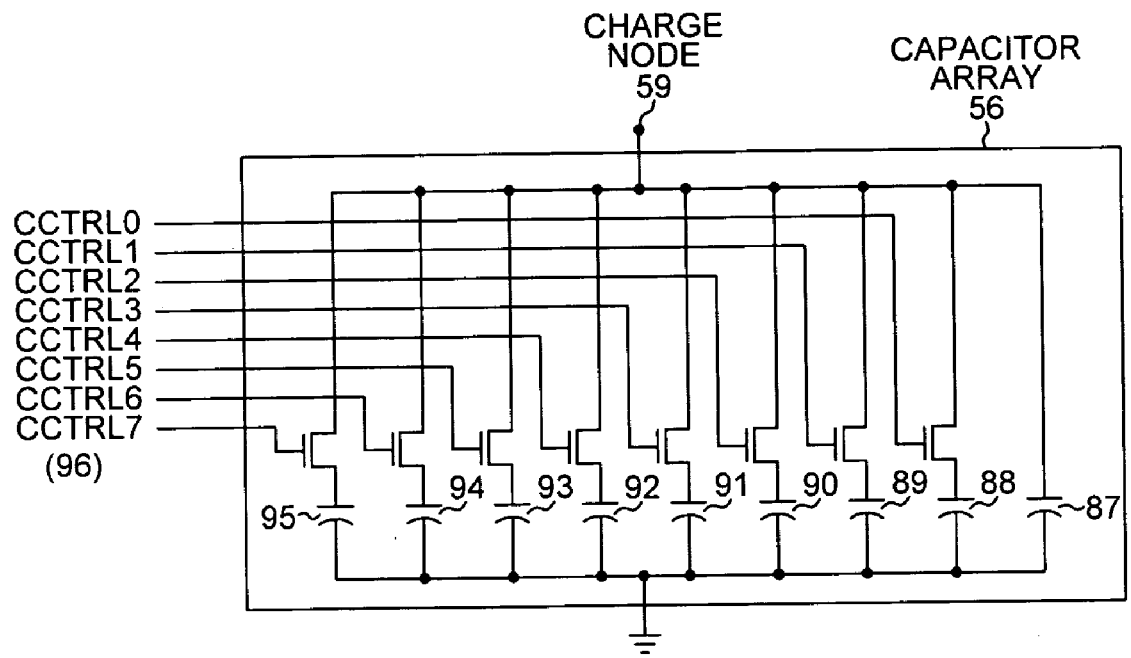
FIG. 8 is a more detailed schematic diagram of the components of a capacitor array of the internal temperature-compensated precision oscillator of FIG. 3.

FIG. 8 is a schematic circuit diagram showing one embodiment of capacitor array 56. In this embodiment, capacitor array 56 includes nine polysilicon-metal sandwich capacitors 87–95. Capacitor 87 is coupled directly to charge node 59. Eight capacitors 88–95 are coupled to charge node 59 through switches. In this embodiment, each of the switches is an n-channel field effect transistor. Individual switches are turned on by asserting individual bits of an 8-bit capacitor control signal (CCTRL) 96. The corresponding eight capacitor control bits are stored in programmable oscillator control register 42. By coupling various capacitors to charge node 59, the capacitance that determines the RC time constant can be controlled and the frequency of the internal clock signal (CLK) can be set.

Figure 9:
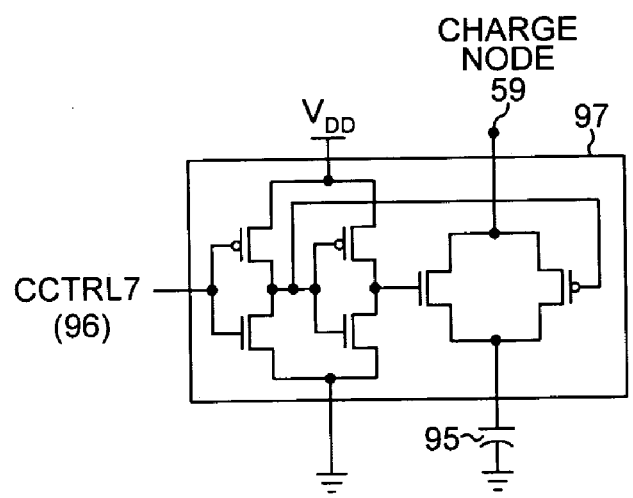
FIG. 9 is a schematic diagram of an alternative embodiment of a component of the capacitor array of FIG. 8.

FIG. 9 is a schematic circuit diagram of another embodiment of the switches of FIG. 8. FIG. 9 shows a switch 97 that receives the eighth bit (CCTRL7) of capacitor control signal (CCTRL) 96. Capacitor 95 is coupled to charge node 59 through switch 97.

Figure 10:
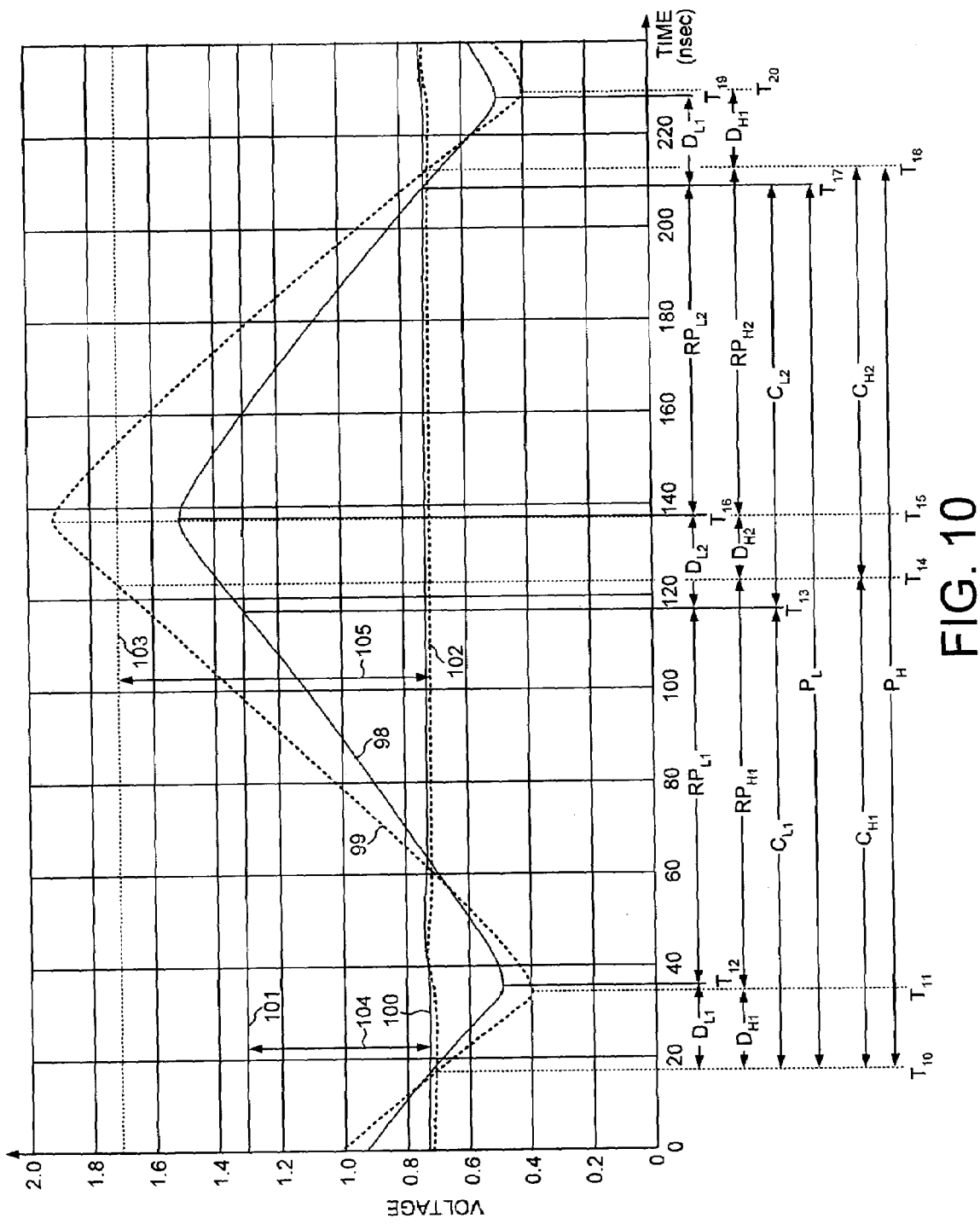
FIG. 10 is diagram of two voltage waveforms on a charge node of the internal temperature-compensated precision oscillator at two temperatures.

FIG. 10 is a waveform diagram illustrating the operation of one specific embodiment of ITCP oscillator 32 at a lower temperature (−40° C.) and at a higher temperature (+105° C.). FIG. 10 shows a node voltage signal 98 (shown as a solid curve) present on charge node 59 at the lower temperature and a node voltage signal 99 (shown as a dashed curve) present on charge node 59 at the higher temperature. The time that elapses from a time $T_{10}$ at which the voltage of node voltage signal 98 falls below a lower trigger voltage 100 until a time $T_{17}$ at which the voltage of node voltage signal 98 next falls below lower trigger voltage 100 equals the period $P_L$ of one cycle of node voltage signal 98 at the lower temperature. The period $P_L$ of one cycle of node voltage signal 98 is about 190 nanoseconds at the lower temperature. The period $P_L$ corresponds to the frequency of clock pulses output by ITCP oscillator 32 as internal clock signal (CLK).

A delay period $D_{L1}$ occurs after the voltage of node voltage signal 98 falls below lower trigger voltage 100 at time $T_{10}$ and before current controller 45 switches the direction of charge/discharge current 60 at $T_{12}$ to add charge to charge node 59. A remainder period $RP_{L1}$ occurs from time $T_{12}$ when current controller 45 begins to add charge to charge node 59 until a time $T_{13}$ when the voltage of node voltage signal 98 rises above an upper trigger voltage 101. The delay period $D_{L1}$ plus the remainder period $RP_{L1}$ makes up a cycle portion ($C_{L1}$) of node voltage signal 98. In this embodiment, cycle portion ($C_{L1}$) is more than half of the period $P_L$ of a cycle of internal clock signal (CLK) in part because charge/discharge current 60 discharges charge node 59 at a faster rate than charge/discharge current 60 charges charge node 59.

An additional delay period $D_{L2}$ occurs before current controller 45 switches the direction of charge/discharge current 60 at $T_{16}$ to discharge charge from charge node 59. Delay period $D_{L2}$ includes the time it takes after $T_{13}$ until upper trigger voltage comparator 62 outputs a digital low. A remainder period $RP_{L2}$ occurs from time $T_{16}$ when current controller 45 begins to discharge charge from charge node 59 until time $T_{17}$ when the voltage of node voltage signal 98 again falls below lower trigger voltage 100. The resistance R of resistor string 57 is higher at the higher temperature than at the lower temperature because resistor string 57 has a positive temperature coefficient. In this embodiment, the larger resistance R decreases the lower trigger voltage slightly and increases the upper trigger voltage substantially. FIG. 10 shows the lower trigger voltage 100 of about 0.74 V decreasing to decreased lower trigger voltage 102 of about 0.72 V. The upper trigger voltage 101 of about 1.31 V increases to an increased upper trigger voltage 103 of about 1.71 V. Thus, a range 104 between lower and upper trigger voltages is about 0.57 V at the lower temperature, whereas a range 105 between trigger voltages is about 0.99 V at the higher temperature.

ITCP oscillator 32 compensates for changes in the resistance R of resistor string 57 caused by the change from the lower temperature to the higher temperature such that internal clock signal (CLK) that is substantially independent of operating temperature. Despite the different ranges between trigger voltages, internal clock signal (CLK) has a frequency corresponding to period $P_L$ at the lower temperature and to a period $P_H$ at the higher temperature, where period $P_H$ is minimally longer than $P_L$, as shown in FIG. 10.

In this embodiment, ITCP oscillator 32 adjusts inverter sink current (ISNK) 69, inverter source current (ISRC) 70, as well as charge/discharge current 60 to compensate for the temperature induced changes to the RC time constant. ITCP oscillator 32 increases charge/discharge current 60 as temperature increases so that charge node 59 charges and discharges faster as the range between trigger voltages increases with increasing temperature. FIG. 10 shows that charge/discharge current 60 charges and discharges charge node 59 faster at the higher temperature because the slope of node voltage signal 99 (dashed curve) at +105° C. is steeper than the slope of node voltage signal 98 (solid curve) at −40° C. The faster charging and discharging of charge node 59, however, does not entirely compensate for the larger range between trigger voltages at the higher temperature. FIG. 10 shows that, despite the steeper slope of node voltage signal 99, a remainder period $RP_{H1}$ at the higher temperature is nevertheless longer than the remainder period $RP_{L1}$ at the lower temperature.

ITCP oscillator 32 compensates for this discrepancy in remainder periods by decreasing the delay period $D_{H1}$ at the higher temperature relative to the delay period $D_{L1}$ at the lower temperature. The delay period $D_{H1}$ includes the response time of lower trigger voltage comparator 61. The delay period is shortened when current controller 45 adjusts inverter sink current (ISNK) 69 to shorten the response time of lower trigger voltage comparator 61. In a similar fashion, current controller 45 adjusts inverter source current (ISRC) 70 to shorten the response time of upper trigger voltage comparator 62, thereby reducing the delay period $D_{L2}$ to a shortened delay period $D_{H2}$ at the higher temperature.

ITCP oscillator 32 thereby adjusts the delay periods such that the sum of the delay periods plus the remainder periods remains substantially constant at the lower temperature and at the higher temperature. At both temperatures, ITCP oscillator 32 adjusts inverter sink current (ISNK) 69, inverter source current (ISRC) 70, and charge/discharge current 60 such that $D_{L1}+RP_{L1}+D_{L2}+RP_{L2}=P_L \approx P_H=D_{H1}+RP_{H1}+D_{H2}+RP_{H2}$. The period $P_H$ of one cycle of node voltage signal 99 is about 195 nanoseconds at the higher temperature. Thus, the period of a cycle of node voltage signal 99 at the higher temperature (+105° C.) is only about 2.6% longer than the period of a cycle of node voltage signal 98 at the lower temperature (−40° C.), despite the 145° C. temperature difference. The period of a cycle of internal clock signal (CLK) output by ITCP oscillator 32 remains substantially constant over the entire range of operating temperatures of ITCP oscillator 32.

Figure 11:
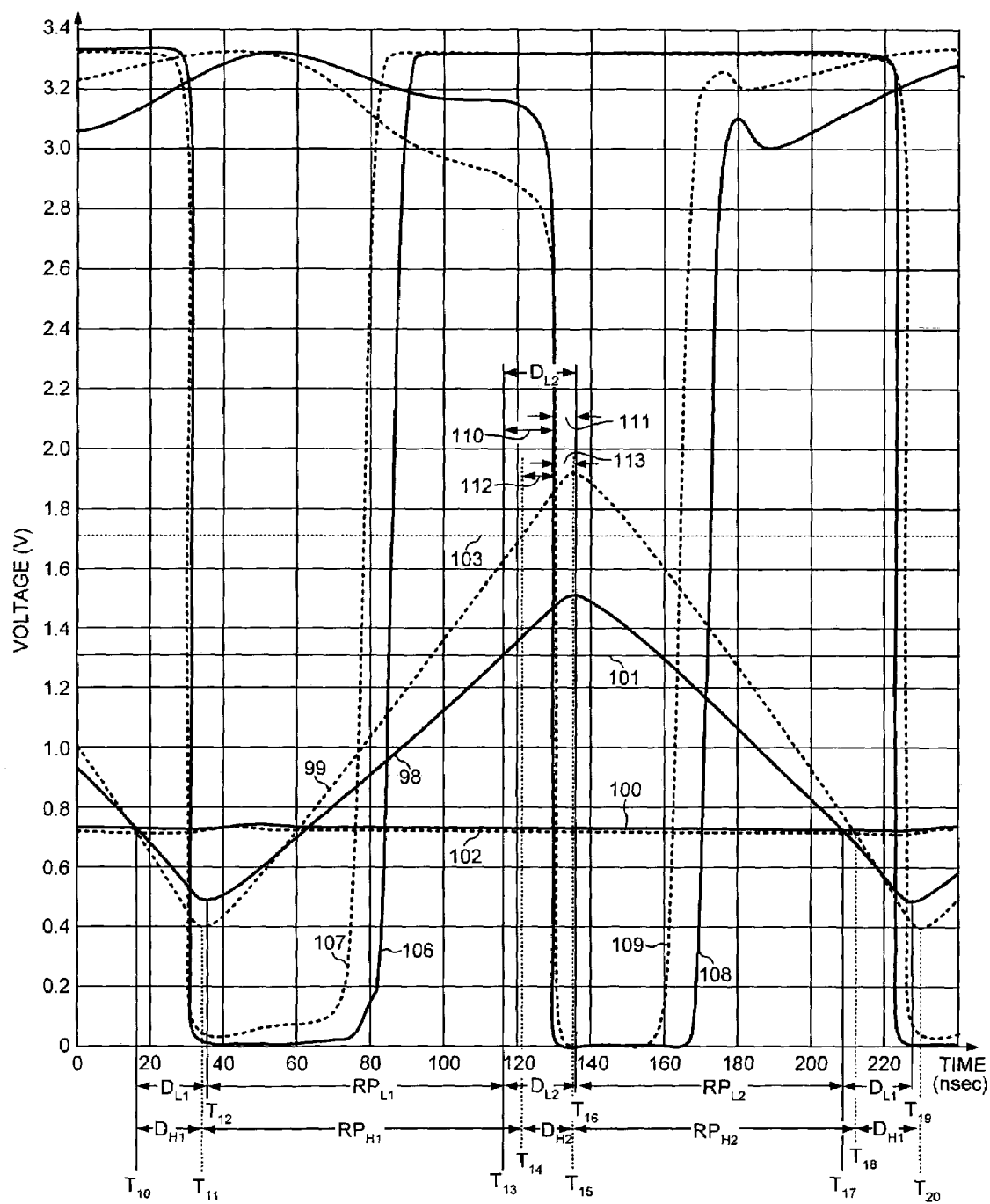
FIG. 11 is a waveform diagram illustrating the operation of the internal temperature-compensated precision oscillator at the two temperatures.

FIG. 11 is a diagram showing voltage waveforms in addition to node voltage signals 98 and 99 that illustrate the operation of ITCP oscillator 32 at the lower temperature and at the higher temperature. FIG. 11 shows the voltage waveforms output by lower trigger voltage comparator 61 and upper trigger voltage comparator 62. Lower trigger voltage comparator 61 outputs waveform 106 (solid) at the lower temperature (−40° C.) and waveform 107 (dashed) at the higher temperature (+105° C.). Upper trigger voltage comparator 62 outputs waveform 108 (solid) at the lower temperature (−40° C.) and waveform 109 (dashed) at the higher temperature (+105° C.).

FIG. 11 illustrates the contribution of the response time of the comparators to the overall delay periods. The delay periods include the time it takes after crossing a trigger voltage until comparator 61 or comparator 62 switches its digital output. For example, delay period $D_{L2}$ at the lower temperature includes a response time 110 after $T_{13}$ until upper trigger voltage comparator 62 outputs a digital low. The time at which upper trigger voltage comparator 62 is shown in FIG. 11 to have output a digital low corresponds to the point at which waveform 108 is approximately half way between its maximum voltage of about 3.3 V and its minimum voltage of about zero volts. In addition to response time 110 of upper trigger voltage comparator 62, delay period $D_{L2}$ also includes a delay 111 attributable to RS latch 63 and current controller 45.

At the higher temperature, delay period $D_{H2}$ includes a response time 112 after $T_{14}$ until upper trigger voltage comparator 62 outputs a digital low. Upper trigger voltage comparator 62 is shown in FIG. 11 to output a digital low at the point at which waveform 109 (dashed) is approximately half way between its maximum voltage and minimum voltage. Delay period $D_{H2}$ includes a delay 113 attributable to RS latch 63 and current controller 45 at the higher temperature. FIG. 11 illustrates that ITCP oscillator 32 produces a shorter response time 112 at the higher temperature and a longer response time 110 at the lower temperature. The shorter response time 112 at the higher temperature significantly compensates for the longer remainder period $RP_{H1}$ at the higher temperature that results from the larger range between trigger voltages at the higher temperature.

Figure 12:
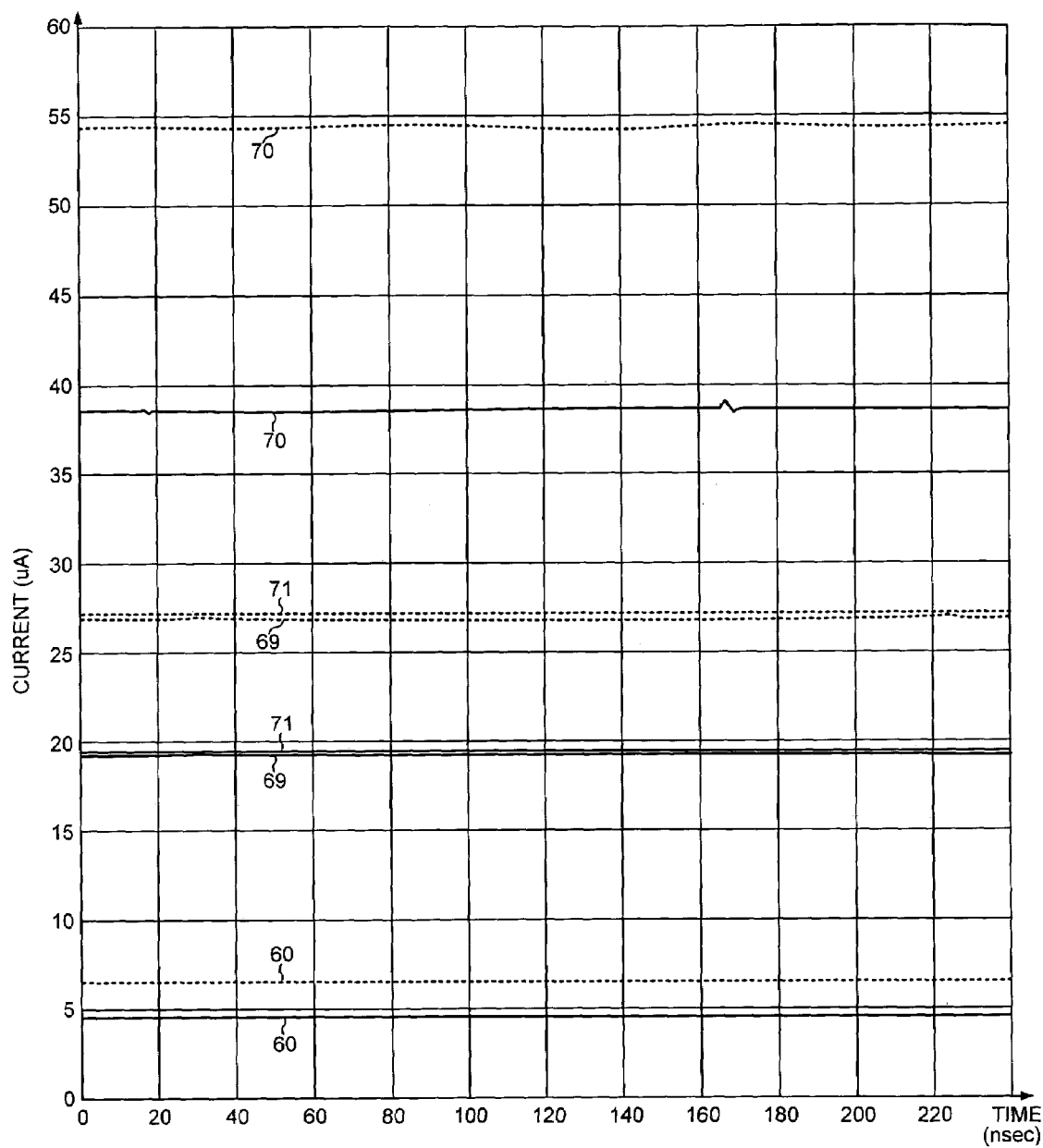
FIG. 12 is a diagram of current waveforms illustrating the operation of the internal temperature-compensated precision oscillator at the two temperatures.

FIG. 12 shows current waveforms that illustrate the operation of ITCP oscillator 32 at the lower temperature and at the higher temperature. Current waveforms at both temperatures are shown for charge/discharge current 60, inverter sink current (ISNK) 69, inverter source current (ISRC) 70 and trigger voltage current (ITHRSD) 71. These current waveforms are output by current controller 45 during the period of the 200-nanosecond cycles of node voltage signals 98 and 99 shown in FIGS. 10 and 11. The current waveforms are shown as solid curves at the lower temperature (−40° C.) and as dashed curves at the higher temperature (+105° C.). FIG. 12 shows that the magnitude of inverter sink current (ISNK) 69 and inverter source current (ISRC) 70 increases with increasing temperature, which enables ITCP oscillator 32 to decrease comparator response times as temperature increases.

When one specific embodiment of ITCP oscillator 32 shown in FIG. 4 was manufactured on silicon, the frequency variation of internal clock signal (CLK) output onto internal clock output lead 38 varied with temperature variation to a greater exent than intended and than simulated with a circuit simulation program. The specific embodiment was included in the Z8F042abb product series produced by ZiLOG, Inc. The simulated variation of the oscillation frequency of the embodiment of ITCP oscillator 32 was much smaller than the actual silicon test results. The frequency variation over process, voltage and temperature (PVT) variations was intended to fall within a frequency range of ±4%.

Figure 13:
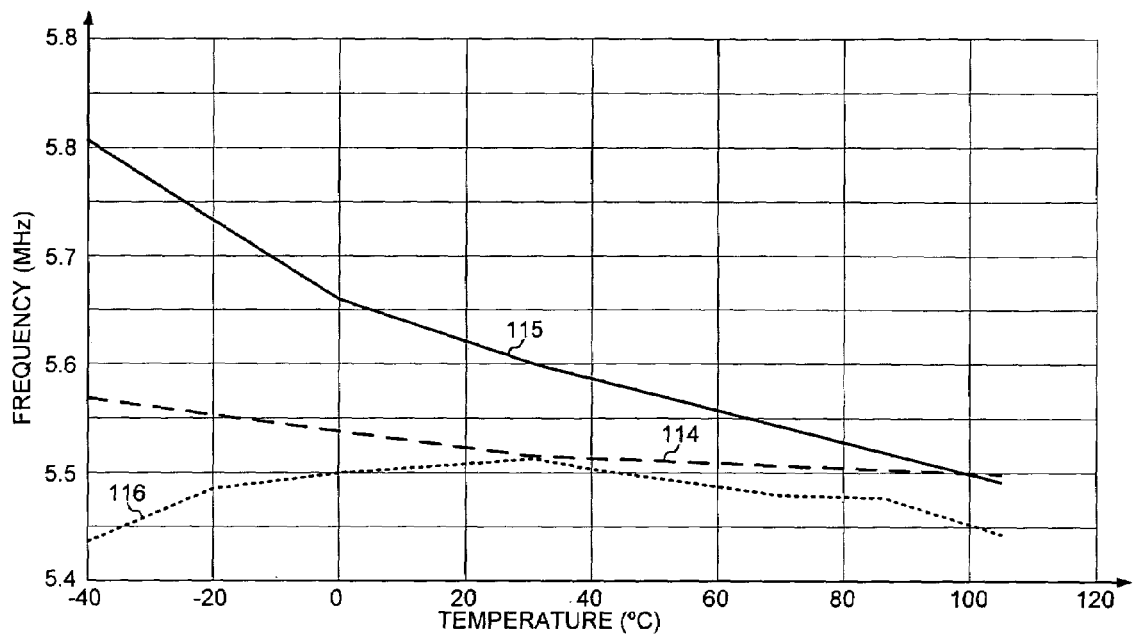
FIG. 13 is a graph comparing simulated versus actual frequency variation over temperature of an embodiment of the internal temperature-compensated precision oscillator.

FIG. 13 is a graph comparing the simulated frequency variation over temperature to the actual silicon test results. A dashed curve 114 shows that version 1.3 of the SPICE simulation program modified by TSMC (Taiwan Semiconductor Manufacturing Company) indicates that the clock frequency of internal clock signal (CLK) will be about 5.57 MHz at −40° C. and about 5.50 MHz at 105° C., where the clock frequency is about 5.5296 MHz at a room temperature of about 30° C. A curve 115 shows that the actual clock frequency of internal clock signal (CLK) was about 5.81 MHz at −40° C. and about 5.49 MHz at 105° C., also for a clock frequency of about 5.5296 MHz at about 30° C. Whereas the simulated clock frequency output by the embodiment of ITCP oscillator 32 varied between 0.7% and −0.5%, the actual frequency varied between 5.1% and −0.7%. The frequency of the ITCP oscillator 32 manufactured on silicon did not perform as simulated and even exceeded the ±4% tolerance allowed by the specification. FIG. 13 shows that the effects of temperature variation are not always modeled adequately in circuit simulation programs.

To avoid the waste of fabricating non-compliant oscillators, a method is disclosed for programmably adjusting the bias currents supplied to the comparators of inverting circuit 47 so as to reduce the variation of the frequency of internal clock signal (CLK) with varying temperature. Dotted curve 116 shows the reduced variation of the clock frequency output by an embodiment of ITCP oscillator 32 wherein the bias currents supplied to the comparators of inverting circuit 47 are programmably adjusted after fabrication. Dotted curve 116 shows that the frequency of internal clock signal (CLK) was about 5.44 MHz at −40° C., about 5.55 MHz at about 30° C., and about 5.45 MHz at 105° C. after the bias currents were programmably adjusted.

Figure 14:
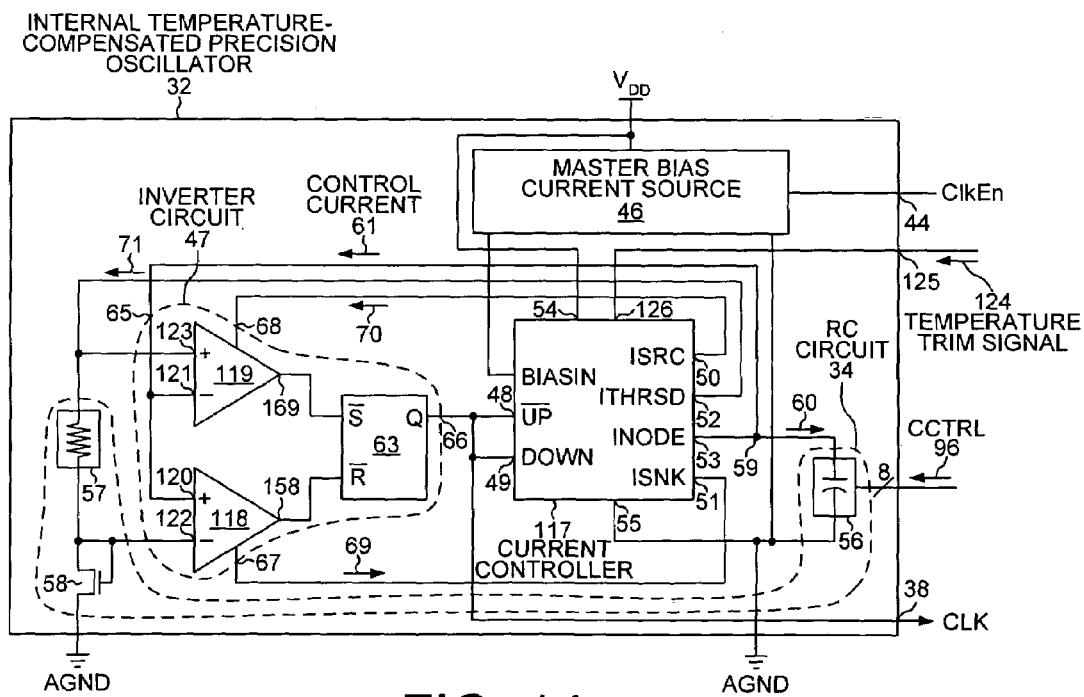
FIG. 14 is a simplified schematic circuit diagram of an embodiment of the internal temperature-compensated precision oscillator including a current controller, a lower trigger voltage comparator and an upper trigger voltage comparator.

FIG. 14 is a schematic circuit diagram of another embodiment of ITCP oscillator 32 in which inverter sink current (ISNK) 69 and inverter source current (ISRC) 70 are programmably adjustable. This embodiment of ITCP oscillator 32 includes a current controller 117 that draws inverter sink current (ISNK) 69 into inverter sink output lead 51 from a lower trigger voltage comparator 118. Current controller 117 also supplies inverter source current (ISRC) 70 from inverter source output lead 50 to an upper trigger voltage comparator 119. Charge node 59 is coupled both to a non-inverting input lead 120 of lower trigger voltage comparator 118 and to an inverting input lead 121 of upper trigger voltage comparator 119. The lower trigger voltage is present on an inverting input lead 122 of lower trigger voltage comparator 118, and the upper trigger voltage is present on a non-inverting input lead 123 of upper trigger voltage comparator 119.

By asserting individual bits of a 6-bit temperature trim signal 124, the bias currents and thereby the frequency variation over temperature of ITCP oscillator 32 are programmably adjusted. ITCP oscillator 32 receives temperature trim signal 124 onto an input lead 125, which is coupled to a temperature trim input lead 126 of current controller 117.

Returning to FIG. 3, clock controller 35 includes a programmable temperature trim register 127 that stores the six temperature trim bits T[5:0]. Processor 36 can write to register 127 using address decoder 43.

Figure 15:
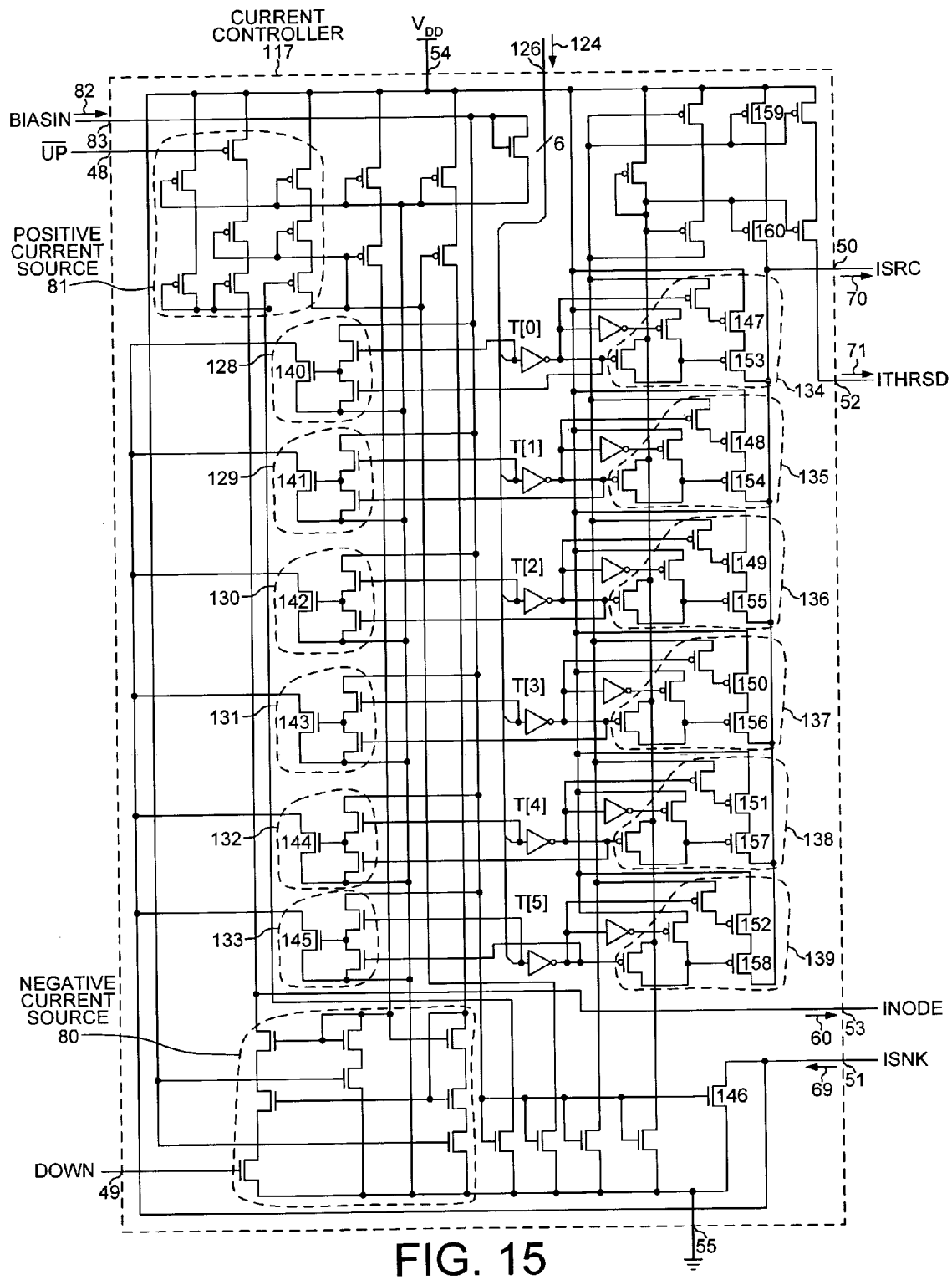
FIG. 15 is a more detailed circuit diagram of the current controller of FIG. 14.

FIG. 15 shows current controller 117 in more detail. Current controller 117 includes six 3-switch modules 128–133 that are used to adjust inverter sink current (ISNK) 69, as well as six 5-switch modules 134–139 that are used to adjust inverter source current (ISRC) 70. The switches of modules 128–133 are n-channel field effect transistors, and the switches of modules 134–139 are p-channel field effect transistors. Successive bits of temperature trim signal 124 are received by pairs of the 3-switch and 5-switch modules. For example, module 128 receives the first bit T[0] of temperature trim signal 124, and module 134 receives an inverted first bit.

The magnitude of inverter sink current (ISNK) 69 is adjusted based on the size of the transistors in modules 128–133 that receive an asserted bit of temperature trim signal 124. Modules 128–133 include transistors 140–145 with the relative sizes 1, 2, 4, 8, 16 and 32, respectively. In one embodiment, transistor 140 has a width of 2.5 microns and a length of two microns. If no temperature trim bits are asserted, the magnitude of inverter sink current (ISNK) 69 is based on the size of a transistor 146, whose size is equal to that of transistor 140. Thus, if only the first two bits T[1:0] of temperature trim signal 124 are asserted, the magnitude of inverter sink current (ISNK) 69 is adjusted to be four times its magnitude with no temperature trim bits asserted.

In a similar manner, the magnitude of inverter source current (ISRC) 70 is adjusted based on the size of the transistors in modules 134–139 that receive an inverted asserted bit of temperature trim signal 124. Modules 134–139 include transistors 147–152 with the relative sizes 1, 2, 4, 8, 16 and 32, respectively. In one embodiment, transistor 147 has a width of five microns and a length of two microns. For each of the transistors 147–152, each module 134–139 includes a twin transistor of the same size. FIG. 15 shows the twin transistors 153–158 for each of transistors 146–151, respectively. If no temperature trim bits are asserted, the magnitude of inverter source current (ISRC) 70 is based on the size of twin transistors 159–160, whose sizes are equal to that of transistors 147 and 153. Thus, if the first three bits T[2:0] of temperature trim signal 124 are asserted, the magnitude of inverter source current (ISRC) 70 is adjusted to be eight times its magnitude when no temperature trim bits are asserted.

Figure 16:
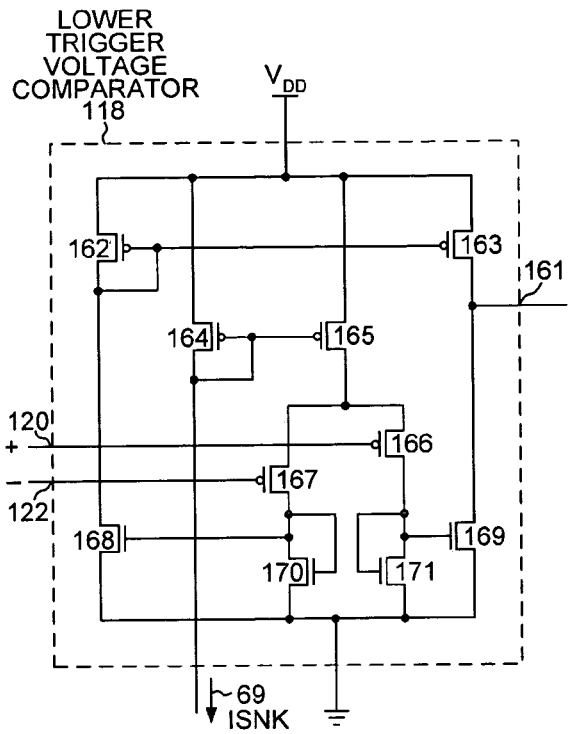
FIG. 16 is a more detailed circuit diagram of the lower trigger voltage comparator of FIG. 14.

FIG. 16 is a more detailed circuit diagram of lower trigger voltage comparator 118 of the embodiment of ITCP oscillator 32 of FIG. 14. Lower trigger voltage comparator 118 outputs a digital low onto an output lead 161 when the voltage on charge node 59 and on non-inverting input lead 120 falls below a lower trigger voltage present on inverting input lead 122. Lower trigger voltage comparator 118 includes ten transistors 162–171. Transistors 164–165 are the same size, whereas the analogous transistors of the current mirror of lower trigger voltage comparator 61 of the embodiment of ITCP oscillator 32 of FIG. 4 have a 1:4 size ratio. Inverter sink current (ISNK) 69 flows through transistor 164 and is adjusted by current controller 117. In the embodiment of FIG. 4, the magnitude of inverter sink current (ISNK) 69 is set, in part, by the ratio of the sizes of the analogous transistors of lower trigger voltage comparator 61. The sizes of the analogous transistors cannot be changed after fabrication to compensate for inaccuracies in the modelling of temperature variation by the circuit simulation program used to design ITCP oscillator 32. After ITCP oscillator 32 is manufactured on silicon, however, the bias currents to the comparators and the charge/discharge current can be programmably adjusted to compensate for the inaccuracies in the simulated temperature variations upon which the design of ITCP oscillator 32 is based.

Figure 17:
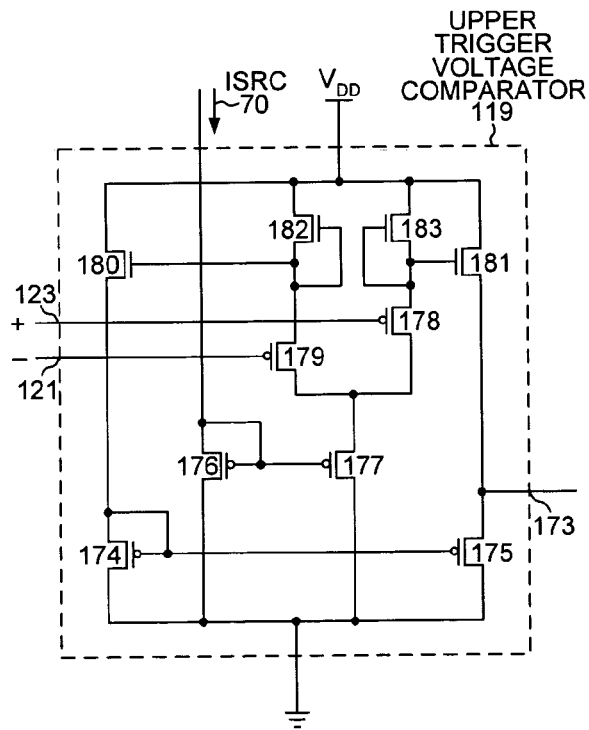
FIG. 17 is a more detailed circuit diagram of the upper trigger voltage comparator of FIG. 14.

FIG. 17 is a more detailed circuit diagram of upper trigger voltage comparator 119 of the embodiment of ITCP oscillator 32 of FIG. 14. Upper trigger voltage comparator 119 outputs a digital low onto an output lead 173 when the voltage on charge node 59 and on inverting input lead 121 rises above an upper trigger voltage present on non-inverting input lead 123. Upper trigger voltage comparator 119 includes ten transistors 174–183. Transistors 176–177 are the same size, whereas the analogous transistors of the current mirror of upper trigger voltage comparator 62 of the embodiment of ITCP oscillator 32 of FIG. 4 have a 1:4 size ratio. Inverter source current (ISRC) 70 flows through transistor 176 and is adjusted by current controller 117. In the embodiment of FIG. 4, the magnitude of inverter source current (ISRC) 70 is set, in part, by the ratio of the sizes of the analogous transistors of upper trigger voltage comparator 62. The sizes of these analogous transistors also cannot be changed after fabrication to compensate for inaccuracies in circuit simulation programs.

FIG. 18 is a table showing an improved simulation of how the frequency of internal clock signal (CLK) output by the embodiment of ITCP oscillator 32 of FIG. 14 varies with temperature at various bias current levels. The various bias current levels of inverter sink current (ISNK) 69 and inverter source current (ISRC) 70 are programmably adjusted by writing the indicated temperature trim bits into programmable temperature trim register 127. For example, if no temperature trim bits are asserted, the magnitude of inverter sink current (ISNK) 69 is $\frac{1}{64}^{th}$ of the maximum magnitude attainable when all temperature trim bits are asserted. FIG. 18 shows that the smallest simulated frequency variation of internal clock signal (CLK) over a temperature range from −40° C. to 105° C. is obtained with a bias current having a magnitude of $\frac{1}{16}^{th}$ of the maximum attainable magnitude. The frequency of internal clock signal (CLK) varied from about −1.6% at a temperature of −40° C. to about −1.5% at a temperature of 105° C. with a $\frac{1}{16}^{th}$ bias current.

FIG. 19 is a table showing how the frequency of internal clock signal (CLK) varies with temperature when the process of fabrication changes. The results were obtained with a constant bias current level of $\frac{1}{16}^{th}$ of the maximum level and with a supply voltage of 3.3 volts. The frequency variation shown for a typical silicon process corresponds to the frequency variation shown in FIG. 18 that was obtained with a $\frac{1}{16}^{th}$ bias current. The smallest frequency variation (−0.9% to −1.2%) was obtained with a slow/fast process, where the slow refers to the speed of the n-channel field-effect transistors (NMOS) and the fast refers to the speed of the p-channel field-effect transistors (PMOS). The process speed depends on the oxide thickness of the silicon.

In yet another embodiment of ITCP oscillator 32, the magnitude of charge/discharge current 60 is programmably adjustable so that charge node 59 charges and discharges at approximately the same rate over the entire range of operating temperatures of ITCP oscillator 32. ITCP oscillator 32 adjusts charge/discharge current 60 to compensate for the temperature induced changes to the RC time constant based on charge rate bits stored in a programmable charge rate register 184. In this embodiment, both the comparator bias currents and the charge/discharge current can be programmably adjusted such that the sum of the delay period plus the remainder period remains substantially constant over the entire range of operating temperatures of ITCP oscillator 32. For example, the frequency of internal clock signal (CLK) output by ITCP oscillator 32 can be programmably adjusted to vary less than ±5% when the operating temperature of ITCP oscillator 32 varies between −40° C. and 105° C.

Although the present invention has been described in connection with certain specific embodiments for instructional purposes, the present invention is not limited thereto. In one specific embodiment described above, the ITCP oscillator 32 compensates for the increasing range between trigger voltages as temperature increases by decreasing comparator response times and by increasing the rate at which the charge node charges and discharges. In other embodiments, ITCP oscillator 32 compensates only by decreasing comparator response times or only by increasing the rate at which the charge node charges and discharges. Although ITCP oscillator 32 is described as fully integrated with and embedded within a microcontroller integrated circuit, and ITCP oscillator can be realized in stand-alone applications and can involve external components. Accordingly, various modifications, adaptations, and combinations of various features of the described embodiments can be practiced without departing from the scope of the invention as set forth in the claims.

What is claimed is:

1. A device comprising:
   a capacitor coupled to a charge node, wherein a node voltage is present on the charge node;
   a current controller with an inverter sink output lead and a trigger voltage source lead, wherein the current controller receives an inverter sink current on the inverter sink output lead;
   a programmable temperature trim register containing temperature trim bits; and
   a comparator with a non-inverting input lead and a comparator sink lead, wherein the non-inverting input lead is coupled to the charge node, and the comparator sink lead is coupled to the inverter sink output lead, wherein the comparator outputs a digital signal that inverts at an end time, wherein the node voltage reaches a first trigger voltage at a start time, wherein a delay period begins at the start time and ends at the end time, wherein a remainder period begins at the end time and ends when the node voltage reaches a second trigger voltage, wherein the second trigger voltage is a first voltage at a first temperature and a second voltage at a second temperature, wherein the delay period is dependent on the inverter sink current, wherein the inverter sink current is dependent on the temperature trim bits, and wherein the sum of the delay period plus the remainder period remains substantially constant at the first temperature and at the second temperature.

2. The device of claim 1, wherein the current controller has a trigger voltage source lead, wherein the comparator has an inverting input lead, and wherein the inverting input lead is coupled through a resistor to the trigger voltage source lead.

3. The device of claim 2, wherein the resistor exhibits a first resistance at the first temperature and a second resistance at the second temperature.

4. The device of claim 1, wherein the capacitor has a capacitance that is programmably adjustable.

5. The device of claim 1, further comprising:
   a second comparator, wherein the comparator detects when the node voltage reaches the first trigger voltage, and wherein the second comparator detects when the node voltage reaches the second trigger voltage.

6. A method comprising:
   (a) detecting when a node voltage reaches a first trigger voltage, wherein the node voltage reaches the first trigger voltage at a start time, wherein a delay period begins at the start time and ends at an end time, and wherein the delay period is dependent on an inverter sink current;
   (b) inverting a digital signal at the end time;
   (c) detecting when the node voltage reaches a second trigger voltage, wherein a remainder period begins at the end time and ends when the node voltage reaches the second trigger voltage, and wherein the second trigger voltage is a first voltage at a first temperature and a second voltage at a second temperature; and
   (d) programmably adjusting the inverter sink current such that the sum of the delay period plus the remainder period remains substantially constant at the first temperature and at the second temperature.

7. The method of claim 6, wherein the inverter sink current is programmably adjusted in (d) by writing temperature trim bits to a programmable temperature trim register.

8. The method of claim 6, further comprising:
(e) writing temperature trim bits to a programmable temperature trim register, wherein the temperature trim bits are used to programmably adjust the inverter sink current in (d).

9. The method of claim 6, wherein a comparator detects when the node voltage reaches the first trigger voltage in (a), and wherein the inverter sink current is a bias current of the comparator.

10. The method of claim 9, wherein a second comparator detects when the node voltage reaches the second trigger voltage in (c), and wherein an inverter source current is a bias current of the second comparator.

11. The method of claim 6, wherein the delay period decreases as the inverter sink current increases.

12. The method of claim 6, wherein the node voltage oscillates at a frequency at which the digital signal is inverted in (b).

13. The method of claim 6, wherein the node voltage is present on a node of a capacitor having a capacitance, and wherein the remainder period depends on the capacitance, further comprising:
(e) programmably adjusting the capacitance.

14. A method comprising:
(a) supplying a charge/discharge current onto a node, wherein a node voltage is present on the node;
(b) detecting when the node voltage reaches a first trigger voltage, wherein the node voltage reaches the first trigger voltage at a start time, wherein a delay period begins at the start time and ends at an end time, and wherein the delay period is dependent on an inverter sink current;
(c) inverting a digital signal at the end time;
(d) detecting when the node voltage reaches a second trigger voltage, wherein a remainder period begins at the end time and ends when the node voltage reaches the second trigger voltage, wherein the remainder period is dependent on the charge/discharge current, and wherein the second trigger voltage is a first voltage at a first temperature and a second voltage at a second temperature; and
(e) programmably adjusting the charge/discharge current and the inverter sink current such that the sum of the delay period plus the remainder period remains substantially constant at the first temperature and at the second temperature.

15. The method of claim 14, wherein the node is coupled to a capacitor having a capacitance, and wherein the remainder period is dependent on the capacitance, further comprising:
(f) programmably adjusting the capacitance.

16. The method of claim 14, wherein the inverter sink current is programmably adjusted in (e) by writing temperature trim bits to a programmable temperature trim register.

17. The method of claim 14, wherein a comparator detects when the node voltage reaches the first trigger voltage in (b), and wherein the inverter sink current is a bias current of the comparator.

18. A system comprising:
a comparator with a non-inverting input lead and a comparator sink lead, wherein a node voltage is present on the non-inverting input lead, wherein the comparator outputs a digital signal and a comparator bias current, wherein the digital signal inverts at an end time, wherein the node voltage reaches a first trigger voltage at a start time, wherein a delay period begins at the start time and ends at the end time, wherein a remainder period begins at the end time and ends when the node voltage reaches a second trigger voltage, wherein the second trigger voltage is a first voltage at a first temperature and a second voltage at a second temperature; and
means for programmably adjusting the comparator bias current such that the sum of the delay period plus the remainder period remains substantially constant at the first temperature and at the second temperature.

19. The system of claim 18, wherein the means comprises a register.

20. The system of claim 18, wherein the means receives a multi-bit temperature trim signal.

* * * * *